United States Patent
Christensen et al.

(10) Patent No.: US 8,260,442 B2
(45) Date of Patent: Sep. 4, 2012

(54) CONTROL SYSTEM FOR A TRANSDUCER ARRAY

(75) Inventors: Knud Bank Christensen, Coatbridge (DK); Klas Åke Dalbjörn, Coatbridge (SE)

(73) Assignee: Tannoy Limited, Lanarkshire (GB)

( * ) Notice: Subject to any disclaimer, the term of this patent is extended or adjusted under 35 U.S.C. 154(b) by 335 days.

(21) Appl. No.: 12/429,690

(22) Filed: Apr. 24, 2009

(65) Prior Publication Data

US 2009/0271005 A1 Oct. 29, 2009

(30) Foreign Application Priority Data

Apr. 25, 2008 (GB) .................................. 0807629.1

(51) Int. Cl.
*G05B 13/02* (2006.01)
*G06F 17/10* (2006.01)

(52) U.S. Cl. .......... 700/55; 708/300; 708/301; 708/815; 708/819

(58) Field of Classification Search .................... 700/55; 708/300, 301, 815, 819
See application file for complete search history.

(56) References Cited

U.S. PATENT DOCUMENTS

| | | | | |
|---|---|---|---|---|
| 6,094,601 A | * | 7/2000 | Popovich | 700/28 |
| 6,408,269 B1 | * | 6/2002 | Wu et al. | 704/228 |
| 6,654,887 B2 | * | 11/2003 | Rhoads | 713/176 |
| 6,910,060 B2 | * | 6/2005 | Langan et al. | 708/819 |
| 6,920,470 B2 | * | 7/2005 | Page et al. | 708/300 |
| 7,146,014 B2 | * | 12/2006 | Hannah | 381/92 |
| 7,741,848 B1 | * | 6/2010 | Olsson et al. | 324/326 |
| 7,788,066 B2 | * | 8/2010 | Taenzer et al. | 702/191 |
| 7,948,236 B1 | * | 5/2011 | Olsson et al. | 702/76 |
| 2009/0257536 A1 | * | 10/2009 | Grbic et al. | 375/350 |
| 2010/0077014 A1 | * | 3/2010 | Swan | 708/318 |
| 2010/0109875 A1 | * | 5/2010 | Ayon et al. | 340/573.1 |

FOREIGN PATENT DOCUMENTS

| | | | |
|---|---|---|---|
| EP | 1343351 A1 | * | 9/2003 |
| JP | 2004040250 | | 2/2004 |
| WO | WO 94/01981 | | 1/1994 |
| WO | WO 97/50186 | | 12/1997 |
| WO | WO 2007140799 A1 | * | 12/2007 |
| WO | WO 2008/056334 | | 5/2008 |

OTHER PUBLICATIONS

Dubey, D., "Smart Sensors", Nov. 2002, M.Tech. Credit Seminar Report, Electronic Systems Group, Electrical Engineering Department, IIT Bombay.*

Li, S.-S.; Lin, Y.-W.; Ren, Z. and Nguyen, C.T.-C., "A Micromechanical Parallel-Class Disk-Array Filter", May 2007, IEEE Intl. Frequency Control Symposium, IEEE Xplore Digital Library.*

Mamishev, A.V.; Sundara-Rajan, K.; Yang, F.; Du, Y. and Zahn, M., "Interdigital Sensors and Transducers", May 2004, Proceedings of the IEEE, vol. 92, No. 5.*

(Continued)

*Primary Examiner* — Mohammad Ali
*Assistant Examiner* — Kelvin Booker
(74) *Attorney, Agent, or Firm* — Alston & Bird LLP

(57) ABSTRACT

A control system is provided for controlling a transducer array. The control system includes a plurality of sparse filters and integrators. The control system can be used to separate signals from a plurality of sources or to generate complex signal patterns that combine and map to different spatial regions.

16 Claims, 5 Drawing Sheets

OTHER PUBLICATIONS

Palumbo, D.L.; Padula, S.L.; Lyle, K.H.; Cline, J.H. and Cabell, R.H., "Performance of Optimized Actuator and Sensor Arrays in an Active Noise Control System", Sep. 1996, NASA Technical Memorandum 110281, U.S. Army Research Lab Technical Report 1226.*

Xu, T.; Bachman, M.; Zeng, F.-G. and Li, G.-P., "Polymeric Micro-Cantilever Array for Auditory Front-End Processing", Feb. 13, 2004, Sensors and Actuators A, Iss. 114, pp. 176-182, Science Direct.*

Claesson, I.; Nordholm, S.E.; Bengtsson, B.A. and Eriksson, P., "A Multi-DSP Implementation of a Broad-Band Adaptive Beamformer for Use in a Hands-Free Mobile Radio Telephone", Feb. 1991, IEEE Transactions on Vehicular Technology, vol. 40, No. 1.*

Farrell, K.R., "Inverse Problems in Array Processing", 2000, CRC Press LLC, Retrieved from the Internet on Apr. 2, 2012 at "www.engnetbase.com".*

Ferrari, L.A. and Sankar, P.V., "Minimum Complexity FIR Filters and Sparse Systolic Arrays", Jun. 1988, IEEE Transactions on Computers, vol. 37, No. 6.*

Lavry, D., "Understanding FIR (Finite Impulse Response) Filters—An Intuitive Approach", 1997, Lavry Engineering, Retrieved from the Internet on Apr. 4, 2012 at "www.lavryengineering.com/white_papers/fir.pdf".*

Liu, Y. and Lin, Z., "On the Applications of the Frequency-Response Masking Technique in Array Beamforming", 2006, Circuits Systems Signal Processing, vol. 25, No. 2, pp. 201-224.*

Maillard, J.P. and Fuller, C.R., "Advanced Time Domain Wave-Number Sensing for Structural Acoustic Systems. II. Active Radiation Control of a Simply Supported Beam", Jun. 1994, Journal of Acoustical Society of America, vol. 95, No. 6.*

Mattera, D.; Palmieri, F. and Haykin, S., "Efficient Sparse FIR Filter Design", May 2002, 2002 IEEE Intl. Conference on Acoustics, Speech and Signal Processing (ICASSP).*

Svensson, U.P., "Energy-Time Relations in a Room with an Electroacoustic System", Sep. 1998, Journal of Acoustical Society of America, vol. 104, No. 3.*

Van Veen, B.D. and Buckley, K.M., "Beamforming: A Versatile Approach to Spatial Filtering", Apr. 1988, IEEE ASSP Magazine.*

Wang, M.; Yang, S. and Wu, S., "Ultra-Wideband Nearfield Adaptive Beamforming Based on a RBF Neural Network", 2005, Advances in Neural Networks—Lecture Notes in Computer Science, vol. 3497/2005.*

Webb, J.L.H. and Munson, Jr., D.C., "Chebyshev Optimization of Sparse FIR Filters Using Linear Programming with an Application to Beamforming", Aug. 1996, IEEE Transactions on Signal Processing, vol. 44, No. 8.*

Webb, J.H. and Munson, Jr., D.C., "Design of Sparse FIR Filters Using Linear Programming", May 1993, 1993 IEEE Intl. Circuits and Systems, vol. 1, pp. 339-342.*

Xilinx®, "Distributed Arithmetic FIR Filter V9.0: Product Specification", Apr. 2005, Retrieved from the Internet on Apr. 4, 2012 at "www.xilinx.com/ipcenter/catalog/logicore/docs/da_fir.pdf".*

Yao, K.; Hudson, R.E.; Reed, C.W.; Chen, D. and Lorenzelli, F., "Blind Beamforming on a Randomly Distributed Sensor Array System", Oct. 1998, IEEE Journal on Selected Areas in Communications, vol. 16, No. 8.*

UK Search Report dated Aug. 29, 2008, Application No. GB0807629.1.

Kirkeby, et al., "Fast Deconvolution of Multi-Channel Systems Using Regularization," *IEEE Transactions on Speech and Audio Processing*, Mar. 1998, pp. 189-195, vol. 6, No. 2.

Heylen, et al., "Integrating Filters for Professional and Consumer Applications," Center for Audio Research and Engineering, University of Essex, Presented at the 96th Convention Feb. 26-Mar. 1, 1994, pp. 1-26.

Heylen, et al., "The Integrating Finite Impulse Response Filter," Audio Research Group, Department of Electronic Systems Engineering, University of Essex, Presented at the 94th Convention, Mar. 16-19, 1993, pp. 1-25.

Heylen, "Digital Audio Equalization Systems," Thesis, Department of Electronic Systems Engineering, University of Essex, Nov. 1995, pp. 1-217.

* cited by examiner

CONTROL SYSTEM FOR A TRANSDUCER ARRAY

FIELD OF THE INVENTION

The present invention relates to a method and apparatus for the control of a transducer array, such as an array of actuators or an array of sensors. The invention has particular, although not exclusive relevance to the control of an array of mechanical or acoustic transducers such as microphones, accelerometers, loudspeakers or exciters. The invention also has relevance to arrays of electromagnetic signal receivers or transmitters.

BACKGROUND OF THE INVENTION

Transducer actuator arrays are known and are used to affect the physical world in some desired way, for instance creating a sound field in a room or a vibration pattern in a mechanical structure. Transducer sensor arrays are also known and are used to record disturbances of interest in the physical surroundings, such as sound or vibration, with some ability to separate the disturbances of interest from others. Typically such transducer arrays are controlled by suitable digital signal processing of the drive signals applied to actuator arrays or by suitable digital signal processing of the sensor signals received from the sensor arrays. The digital signal processing of these signals is computationally intensive and the invention aims to reduce this computational burden.

BRIEF SUMMARY OF THE INVENTION

According to one aspect, the invention provides a sensor array system comprising: a plurality of sensors; a plurality of inputs, each for receiving a signal from a respective one of the plurality of sensors; one or more outputs for outputting signals derived using the signals from said inputs; a plurality of sparse filters each coupled between an input and an output for filtering the sensor signal received at the coupled input; and one or more integrators coupled to one or more of said sparse filters for integrating a signal output from the coupled sparse filter and to provide the integrated signal to the corresponding output.

In one embodiment, a plurality of outputs are provided and a sparse filter is located between each input and each output. In this case, means can be provided for combining the filtered signals obtained from the sparse filters coupled to the same output and an integrator may integrate each combined signal to provide an output signal.

Each sensor may comprise a microphone or an accelerometer and may sense a mix of mechanical or acoustic signals generated from a plurality of sources. Alternatively, each sensor may comprise an electromagnetic sensor such as an RF receiver for sensing RF signals. The sparse filters may be designed so that the or each output mainly comprises the signal from one of said sources.

According to another aspect, the invention provides an actuator array system comprising: a plurality of actuators; one or more inputs, each for receiving a respective control signal; a plurality of outputs, each for outputting a signal to a respective one of the plurality of actuators; a plurality of sparse filters each coupled between an input and an output for filtering the control signal received at the coupled input; and a plurality of integrators coupled to one or more of said sparse filters for integrating a signal output from the coupled sparse filter and to provide the integrated signal to the corresponding output.

In one embodiment, a plurality of inputs are provided and a sparse filter is located between each input and each output. In this case, means may be provided for combining the filtered signals obtained from the sparse filters coupled to the same output and an integrator may integrate each combined signal to provide an output signal.

Each actuator may comprise a loudspeaker or an exciter for generating mechanical or acoustic signals in order to establish a desired sound or vibration field within a region of interest. Alternatively, each actuator may comprise an electromagnetic transmitter for generating and transmitting an electromagnetic signal, such as an RF signal.

The invention also provides a control system for controlling a transducer array, the control system having a plurality of sparse filters and integrators. The control system can be used to separate signals from a plurality of sources or to generate complex signal patterns that combine and map to different spatial regions.

BRIEF DESCRIPTION OF THE SEVERAL VIEWS OF THE DRAWINGS

These and various other aspects of the invention will become apparent, from the following detailed description of embodiments which are given by way of example only and which are described with reference to the accompanying drawings in which:

FIG. 4 is a block diagram illustrating a 2×2 digital control filter matrix which uses the sparse FIR filter shown in FIG. 3a.

DETAILED DESCRIPTION OF THE INVENTION

Sensor Array

Figure 1:
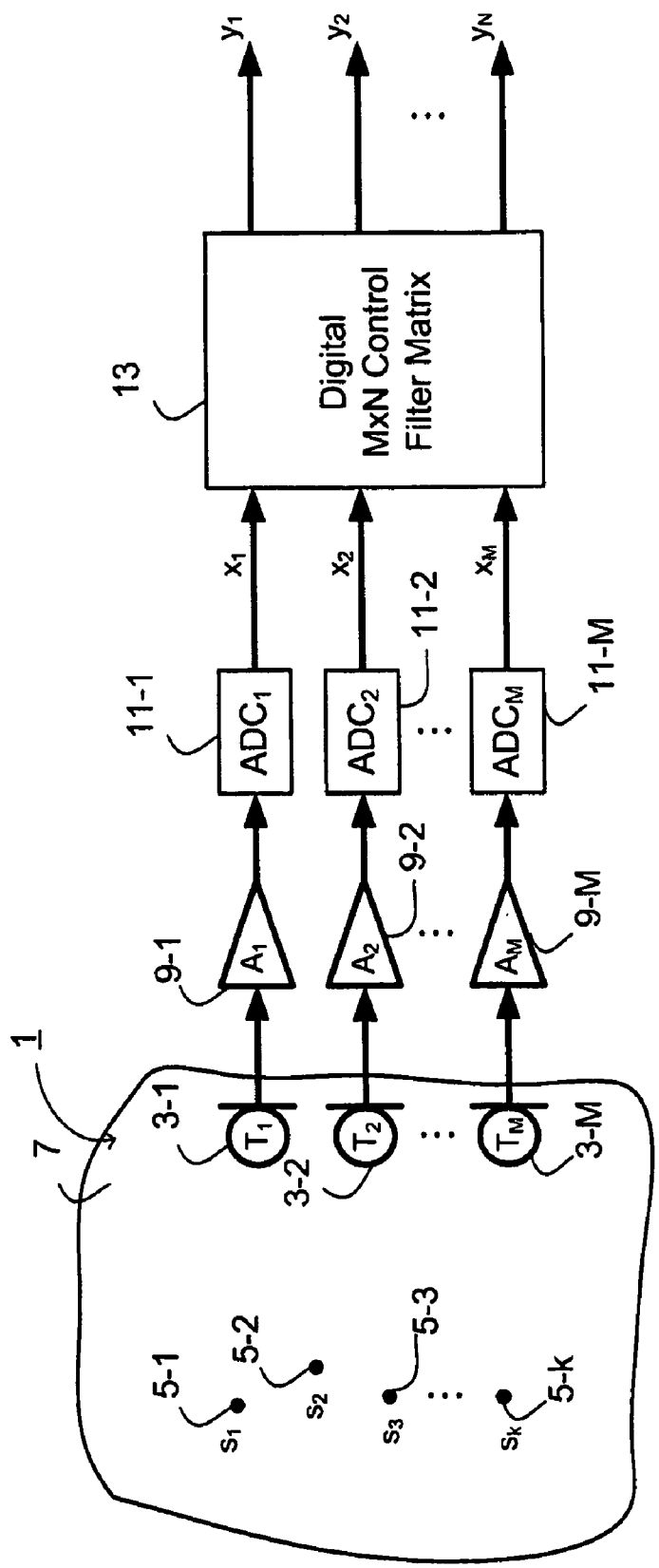
FIG. 1 schematically illustrates a sensor array and processing circuitry for processing the signals obtained from the array, including a digital control filter matrix.

FIG. 1 schematically illustrates a sensor array 1 having M sensors 3-1 to 3-M (where M>1). In this embodiment, the sensors 3 are microphones which sense acoustic signals generated by k sound sources 5-1 to 5-k (illustrated as the points $s_i$ (i=1 to k) in FIG. 1) and which propagate from the sources to the microphones 3 through a transmission medium 7 (in this case air). The signal obtained from each microphone 3 will include a mix of the sound from each of the sources 5. As shown, the signal from each microphone 3 is amplified by a respective amplifier 9-1 to 9-M and then digitised by a respective analogue to digital converter 11-1 to 11-M. The digitised signals (represented as $x_1$ to $x_M$) are then input to a digital M×N control filter matrix 13 which creates N different linear convolutive mixes (represented as $y_1$, to $y_N$) of the M input signals (where N≧1). In this embodiment, the control filter matrix is designed so that the N mixes contain predominantly signals corresponding to those originating from disjunctive sources or spatial regions around them. The signals thus obtained can be used, for example for hands free telephony, teleconferencing, surveillance, noise measurements and machine diagnostics among others.

Figure 2:
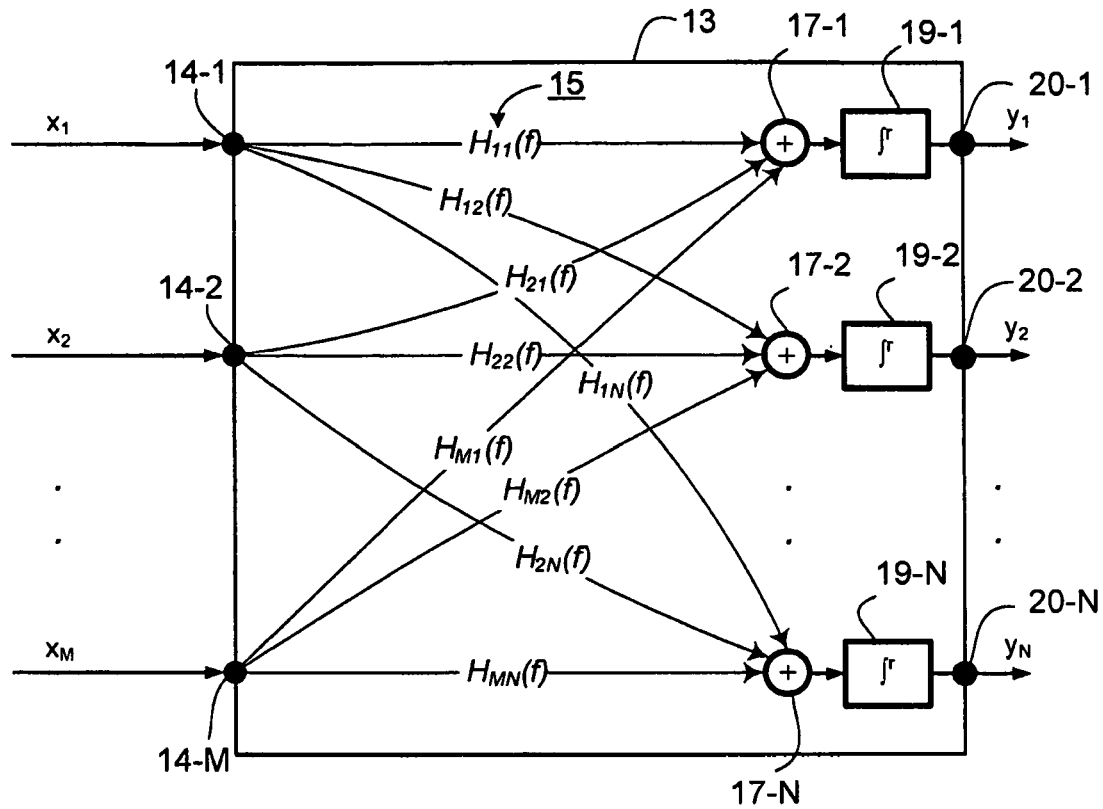
FIG. 2 schematically illustrates the components of the digital control filter matrix shown in FIG. 1.

FIG. 2 schematically illustrates the main components of the digital control filter matrix 13 used in this embodiment. As shown, each of the M signals from the M ADCs 11 are applied via a respective input terminal 14-1 to 14-M, to N sparse FIR filters (generally referenced 15), each associated with one of the N output signals. Thus the input signal $x_1$ is applied to filter $H_{11}(f)$ associated with output $y_1$; filter $H_{12}(f)$ associated with output $y_2$ ... and to filter $H_{1N}(f)$ associated with output $y_N$. Similarly, the input signal $x_2$ is applied to filter $H_{21}(f)$ associated with output $y_1$; filter $H_{22}(f)$ associated with output $y_2$ ... and to filter $H_{2N}(f)$ associated with output $y_N$ etc. The filtered input signals associated with the same output signal are then added together by an adder 17-1 to 17-N and then integrated by a respective $r^{th}$ order integrator 19-1 to 19-N. The outputs from the integrators then form the N outputs (y) of the digital filter control matrix 13 output from output terminals 20-1 to 20-N.

The filter responses of the filters used are chosen to achieve the desired separation of the signals from the different sources. The filter coefficients for these filters can be determined from a number of optimization methods. In the preferred embodiment, they are determined by firstly finding the complex target responses for the array control filters and then by approximating these target responses with Integrating FIR filters. The complex target responses allow the optimization of the filter design by calculating the frequency responses across all transducer channels one frequency at a time, thus solving a sequence of single frequency optimization problems which is much easier than calculating the complete set of filter coefficients for optimal performance at once. The way in which such complex target responses can be determined is described in the paper "Fast Deconvolution of Multichannel Systems Using Regularization" by Ole Kirkebye et al, IEEE Transactions on Speech and Audio Processing, Vol 6, No 2, March 1998 pp 189 to 194, the contents of which are incorporated herein by reference. These determined target responses can then be approximated with Integrating FIR filters using, for example, the techniques described in: "The Integrating Finite Impulse Response Filter", Audio Engineering Society Preprint 3587, Presented at the $94^{th}$ AES Convention in Berlin, Mar. 16-19, 1993 by Robert L. M. Heylen, and Malcolm O. Hawksford, Dept. of Electronic Systems Engineering, University of Essex, Colchester, England; "Integrating Filters for Professional and Consumer Applications", Audio Engineering Society Preprint 3834, Presented at the $96^{th}$ AES Convention in Amsterdam, Feb. 26-Mar. 1, 1994 by Robert L. M. Heylen and Dr Malcolm O. Hawksford, Centre for Audio Research and Engineering, Department of Electronic Systems Engineering, University of Essex, Wivenhoe Park, Colchester CO4 3SQ, UK; and R. Heylen, "Integrating FIR filter for broadband equalization", Ph.D. degree awarded 1996, University of EssexAudio, the contents of which are incorporated herein by reference.

As will be explained in more detail below, by using sparse FIR filters 15 and integrators 19, the required computational overhead (MIPS) can be reduced compared with systems that use more traditional filter technologies.

Sparse FIR Filter

A sparse FIR filter is a conventional FIR filter having a comparatively low number of non-zero coefficients (typically less than 100) spread over a long time axis (for example between 500 and a million samples, but typically several thousand samples). The equation for a FIR filter is given below:

$$FIR_{Output}(n) = \sum_{i=0}^{P-1} a_i x(n-i)$$

Where $a_i$ are the filter coefficients which define the impulse response of the filter and x(n) is the $n^{th}$ input sample value. In a conventional FIR filter most of the filter coefficients $a_i$ are non-zero and the time period over which the filtering is performed (i.e. the number of digital samples involved in the calculation) is defined by P. Thus if filtering over a long time period (large value of P), then the number of multiplication and adds required to calculate the FIR output value for each new input sample can be significant. However, as mentioned above, with a sparse FIR filter, most of the filter coefficients $a_i$ are zero. Typically, with a conventional FIR filter, less than 5% of the filter coefficients will be zero, whereas with a sparse FIR filter between 70% and 99% and preferably between 95% and 98% will be zero.

Figure 3A:
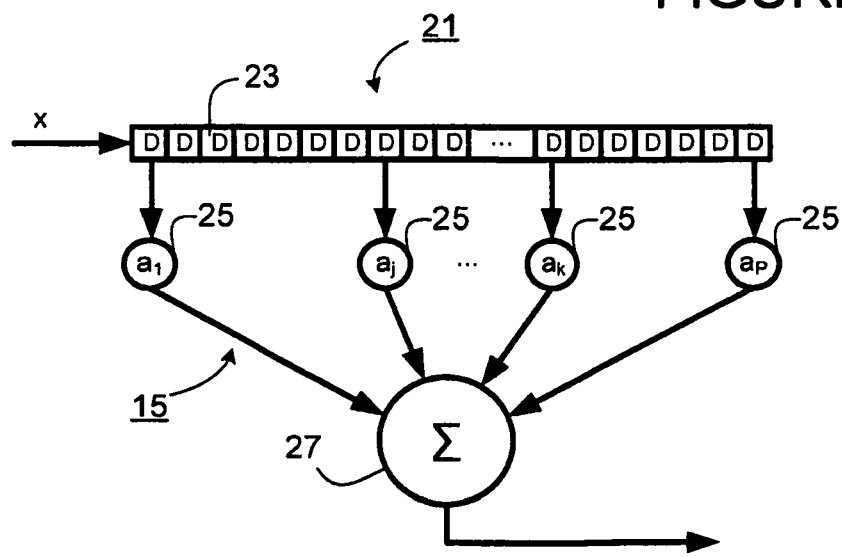
FIG. 3a is a block diagram illustrating the main components of a sparse FIR filter used in the digital control filter matrix shown in FIG. 2.

FIG. 3a is a block diagram illustrating the main components of a sparse FIR filter 15. As shown, the filter 15 includes a tapped delay line 21 having P delay elements 23. Conceptually, the delay line 21 receives at its input on the left, each new digital sample from the ADC 11 at each system clock tick. As each new sample is received at the input, the existing samples in the delay line 21 shift one delay element 23 to the right, with the sample in the last delay element being discarded. In practice, the delay line 21 is implemented as a circular buffer, where the shift operation is implemented by moving an address pointer rather than moving all the data in physical memory.

Once the new sample has been loaded into memory and the memory pointer shifted, the sample values from selected ones of the delay elements 23 (those associated with the non-zero coefficients) are multiplied by a respective filter coefficient 25 and then summed by an adder 27 to generate the sparse filter output at that sample time. In the illustrated filter shown in FIG. 3a, the non-zero filter coefficients include coefficients $a_0$, $a_j$, $a_k$ and $a_{P-1}$.

As mentioned above, the output from the sparse filters 15 are integrated by an $r^{th}$ order integrator 19. The effect of such integration on the output of the sparse filters 15 is to effectively convert the sparse filter 15 into a regular (i.e. non-sparse) FIR filter typically spanning more than 1000 samples. The size (time span) of the resulting FIR filter depends upon the largest absolute frequency resolution ($\Delta f/fs$) of the sparse filter and the density of the sparse coefficient set will determine the detail of the impulse response of the resulting FIR filter. With regard to the order of the integrators 19, any order greater than zero will work. If second order integrators 19 are used, then the combined impulse response of each sparse FIR filter 15 and integrator 19 will be a piecewise linear function and with third order integrators 19, the combined impulse response will be piecewise parabolic.

Figure 3B:
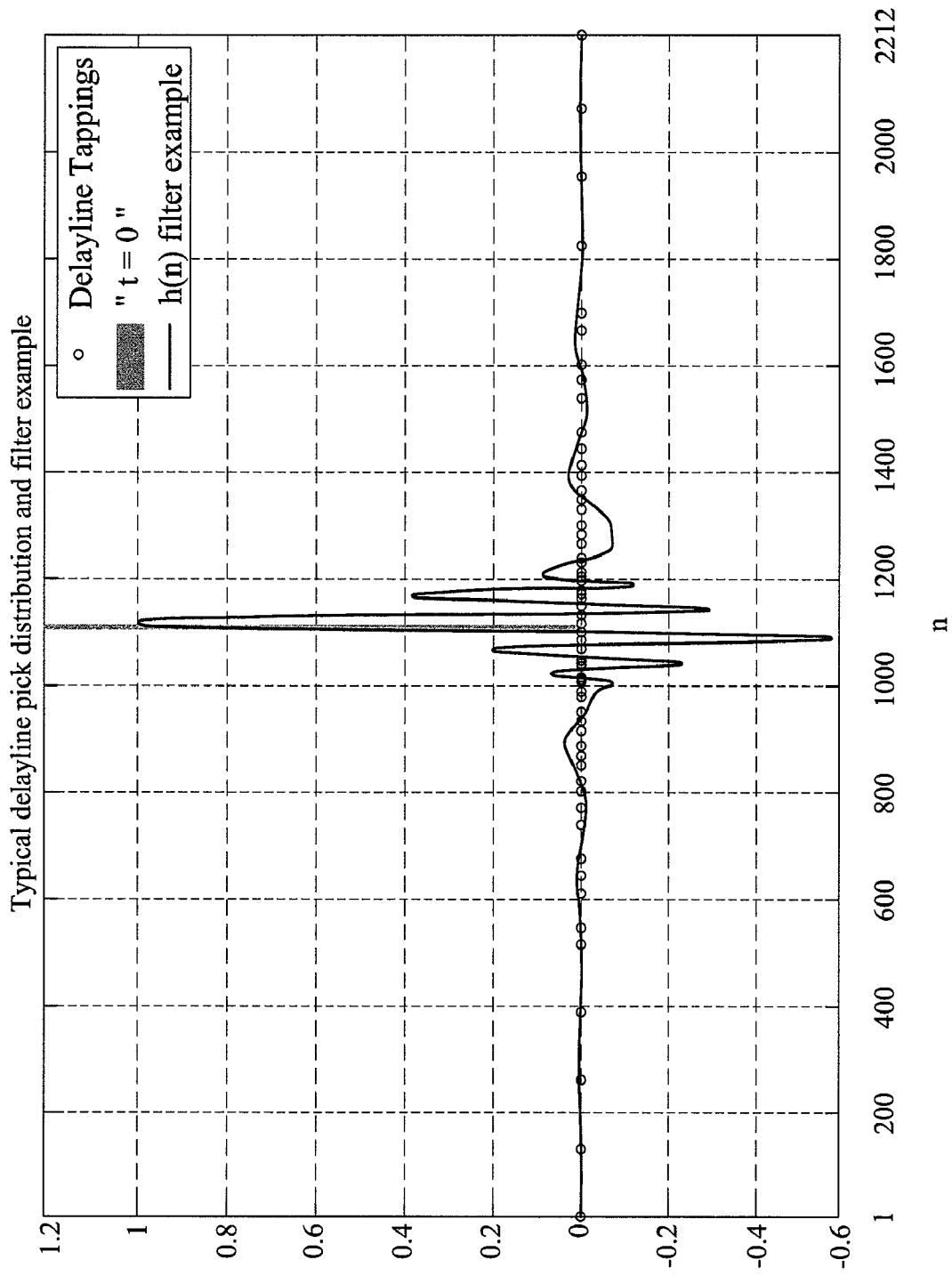
FIG. 3b is a plot illustrating a filter response for a sparse filter and the density of non-zero taps of the filter.

A filter requiring near-constant relative frequency resolution throughout the working range, will typically have progressively shorter ranges of progressively higher tap density towards the "centre" of the filter. If the filter is only used at frequencies substantially below the Nyquist frequency, then even the densest part of the sparse filter may still be quite sparse, say with 8 samples between tappings. For a typical audio application, where the desired frequency resolution is roughly constant on a logarithmic frequency axis, the desired impulse response will be rich in detail near t=d (where d is the overall delay of the filter required for causality) but progressively smoother farther away from t=d. This is illustrated in FIG. 3b, which shows a typical impulse response for an audio application. As can be seen, the impulse response has more taps (represented by the circles on the time (sample) axis) near the centre of the filter response (corresponding to t=d), with the number of taps reducing towards the ends of the filtering window. In other words, in such a typical audio application, there will be more non-zero taps near the centre of the delay line 21 than at its edges. (Indeed, for any filter having an overall symmetric density function, the dense section of the impulse response will be in the middle. However, for more "analogue like" filters the density function should be asymmetric, with the dense section shifted left towards the beginning of the impulse response window.) Therefore, a very long FIR filter with suitable frequency resolution throughout the audio range can be created from a sparse FIR filter 15 with comparatively few taps of progressively decaying density as a function of distance to t=d.

Compared with a conventional direct FIR implementation, the calculation requirements (MIPS) are reduced by an order of magnitude or more. Further, the combined sparse FIR and integrator approach introduces no additional delay compared to a direct FIR implementation (or any other implementation) of a filter response. Neither does it require any block transforms (like FFT-based Fast Convolution), nor band splitting and multiple sampling rates (such as would be used with multi-rate FIR filters). Further, because a sparse filter is used, the coefficient memory requirements compared with conventional filters is substantially reduced, while only a little of this memory saving is lost again to make room for the integrators 19.

Digital Control Filter Matrix

To illustrate the operation of the digital control filter matrix, a description will now be given with reference to FIG. 4 for the case where N=M=2. However, the same operation would be performed for all values of N≧1 and M>1.

Figure 4:
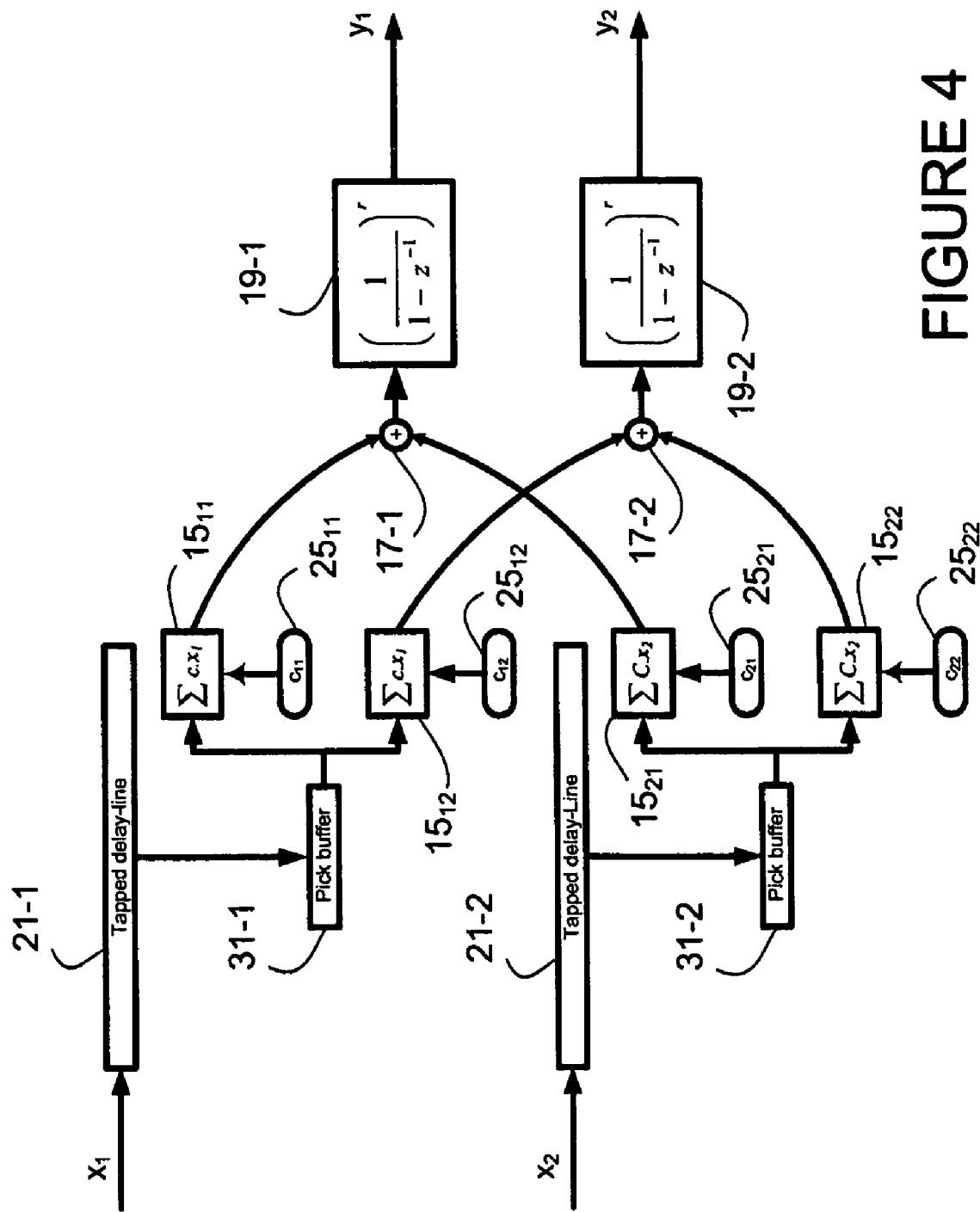

As shown in FIG. 4, the two inputs $x_1$ and $x_2$ are input to tapped delay lines 21-1 and 21-2 respectively. Pick buffers 31-1 and 31-2 are provided for temporarily storing the required samples from the input stream which will be needed in the sparse filter calculations, represented by the calculation boxes $15_{11}$, $15_{12}$, $15_{21}$ and $15_{22}$. As shown, the sparse filter calculations require the corresponding sets of sparse filter coefficients $25_{11}$, $25_{12}$, $25_{21}$ and $25_{22}$ which are stored in memory. As shown, the calculated value (sum of products) from sparse filter calculation box $15_{11}$, is input to adder 17-1, where it is added with the calculated value (sum of products) from sparse filter calculation box $15_{21}$. Similarly, the calculated value (sum of products) from sparse filter calculation box $15_{12}$ is input to adder 17-2, where it is added with the calculated value (sum of products) from sparse filter calculation box $15_{22}$. The combined values obtained from the two adders 17 are then input into a respective integrator 19-1 and 19-2, where the value is integrated to generate the output value. Of course the above process is performed as each new sample of the input signals arrives.

Thus, in the general case of M inputs and N outputs, the processing is as follows:

With every tick of the sample clock:
1) The M tapped delay lines 21 are updated with a respective new input sample value.
2) The M pick buffers 31 are filled with the appropriate samples from the tapped delay lines 21. This step is included in order to gain faster access to the delayed samples which will be re-used N times (for the N sparse filter calculations 15), assuming that reading data from a small piece of consecutive memory is significantly faster than picking out the sparse tappings from the longer delay lines 21.
3) The M×N product summations between the M×N sparse coefficient sets and the contents of the M pick buffers are calculated.
4) For each n of the N outputs:
   a. Sum up the M product sums contributing to output n
   b. Filter the sum through the $n^{th}$ integrator 19, producing the new output sample for the $n^{th}$ output.

Actuator Array

Figure 5:
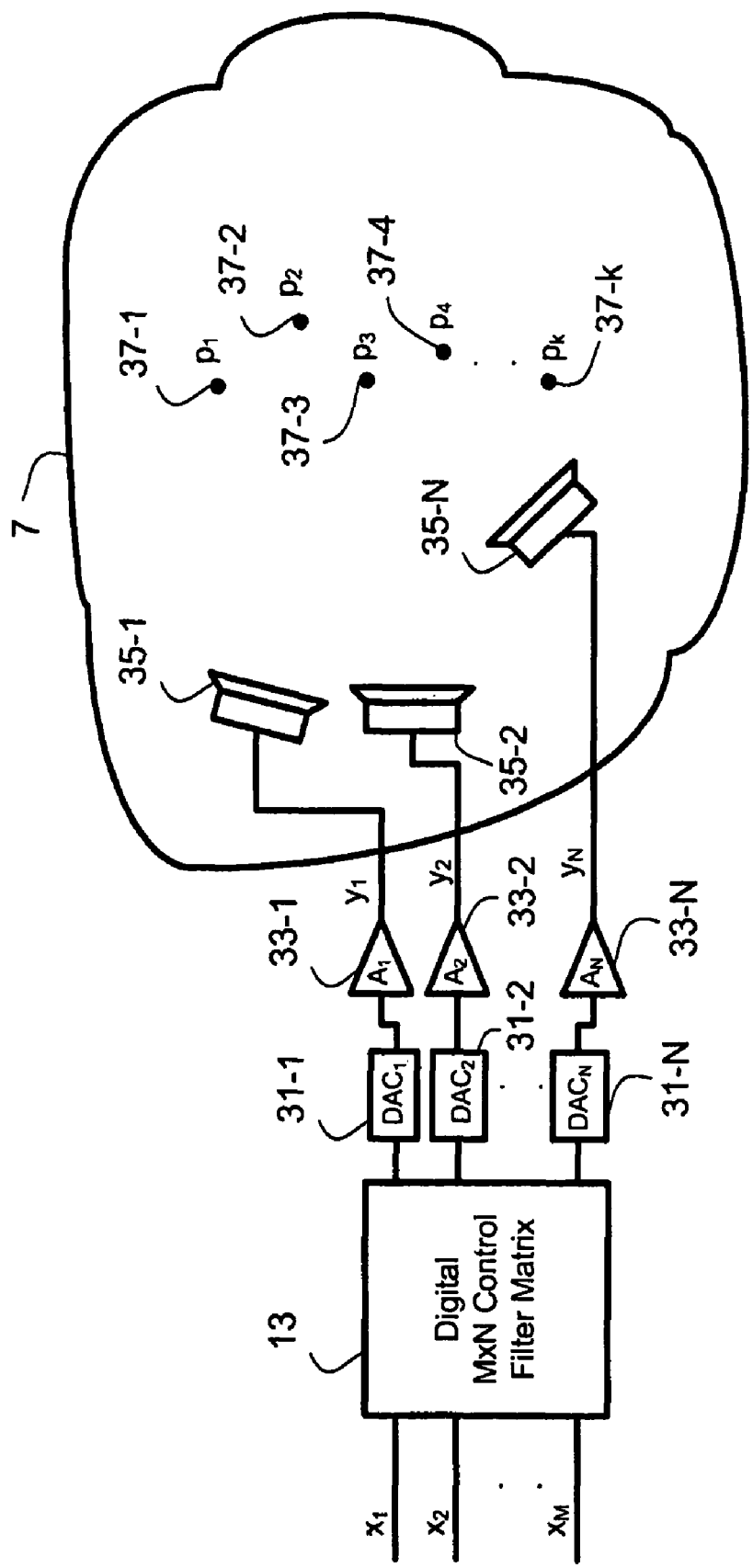
FIG. 5 schematically illustrates an actuator array and processing circuitry for processing drive signals to be applied to the array, including a digital control filter matrix.

FIG. 5 schematically illustrates an actuator array 1 having N actuators 35-1 to 35-N (where N>1). In this embodiment, the actuators 35 are loudspeakers which generate acoustic signals to create, for example a desired sound field within a room 7. The desired sound field is generated by applying a respective drive signal (illustrated as signals $y_1$ to $y_N$) to the loudspeakers 35. These signals are chosen to achieve a desired sound field in each of k regions 37-1 to 37-k, (illustrated as the points $p_i$ (i=1 to k) in FIG. 5). The sound field in each region will be defined by a mixture of the sounds generated by the loudspeakers 35. As illustrated in FIG. 5 the drive signals are generated from M input signals which are applied to the above described digital control filter matrix 13, whose outputs are converted into analogue signals by analogue to digital converters 31-1 to 31-N and amplified by amplifiers 33-1 to 33-N. With this arrangement and by suitable choice of input control signal $x_i$, multiple language zones in a room could be established, so that signals applied to each input will appear at disjunctive sets of observation points (or spatial regions) and will be very nearly inaudible elsewhere. Of course with a single input signal, the system then becomes more like a beam-steering array loudspeaker system, with minimal energy being radiated in directions where no audience is present which also minimises reverberation noise. Of course such an actuator array embodiment could also be used, for example, to create a vibration pattern within a mechanical structure or the active attenuation of noise and/or vibrations through partial cancellation. Again, in this embodiment, the digital control filter matrix 13 is formed from a plurality of sparse FIR filters and integrators in the same manner as described above with the sensor array embodiment. The design of the filters used in the matrix 13 will depend on the application, but appropriate techniques for the filter design can be found in the papers mentioned above. The operation of the digital control filter matrix is the same as in the sensor array embodiment and will not, therefore, be described again.

Modifications and Alternatives

A number of detailed embodiments have been described above. As those skilled in the art will appreciate, a number of modifications and alternatives can be made to the above embodiments whilst still benefiting from the inventions embodied therein. By way of illustration only a number of these alternatives and modifications will now be described.

In the sensor array embodiment described above, the signals sensed by a plurality of microphones were processed to separate desired signals from other signals. As those skilled in the art will appreciate, other sensing transducers such as accelerometers could be used. Similarly, in the actuator array embodiment described above, an array of loudspeakers was used and other actuator arrays, such as exciter arrays may be used instead. Further some embodiments may use sensor arrays with both microphones and accelerometers or actuator arrays with both loudspeakers and exciters, for example for use in active noise cancellation in vehicles. Additionally, where the signals being sensed or generated are not pressure waves, other forms of transducer would be used. For example, where it is desired to generate or sense electromagnetic signals, appropriate electromagnetic signal generators or sensors would be used.

In the above embodiments, transducer arrays were described. The transducers may be arranged in any geometrical arrangement—e.g. linear, random, 2D etc. The term "array" is not intended to place any limits on the possible geometrical distribution of the transducers. It is used to define that there is more than one transducer. The transducers are being used jointly with spectrally overlapping signals to solve a transduction problem.

In the above embodiment, the digital control filter matrix used sparse FIR filters. As those skilled in the art will appreciate, other sparse filters, such as sparse IIR filters may be used instead.

In the above embodiments, the medium in which the signals were sensed or generated was air. In alternative embodiments, the medium may be some other material in which mechanical or acoustic or electromagnetic waves can travel.

In the sensor array embodiment described above, the separated signals obtained at the output of the digital control filter matrix may be stored for subsequent analysis, transmitted to a remote location or output to a user via a display or a loudspeaker. They may also act as control input signals for some other feedback control system, such as a noise cancellation system.

In the above embodiments each input was coupled to each output through a sparse filter. In an alternative embodiment, each output may be coupled to a selection of the inputs.

In the above embodiments the filtered signals coupled to the same output were combined (in the adders 17) and then integrated by a common integrator 19. In an alternative embodiment, separate integrators could be used to integrate the outputs from the sparse filters and then combined by an adder (or subtractor etc).

In the above embodiments, each output was coupled with each input via a sparse filter and integrator. In an alternative embodiment, a subset of the sparse filters may be replaced with a conventional filter.

In the above embodiments, a digital control filter matrix was used to separate mixed signals in the sensor array embodiment or to mix input signals to achieve a desired complex field pattern in the actuator array embodiment. As those skilled in the art will appreciate, the digital control filter matrix may be implemented by dedicated hardware circuits, such as DSP chips and FPGAs (Field Programmable Logic Arrays) for high speed applications or by software modules running on a conventional programmable computer device. The software may be provided in compiled or un-compiled form and may be supplied as a signal over a computer network, or on a recording medium such as a CD-ROM.

That which is claimed:

1. A sensor array system comprising:
    a plurality of sensors;
    a plurality of inputs, each for receiving a signal from a respective one of the plurality of sensors;
    one or more outputs for outputting signals derived using the signals from said inputs;
    a plurality of sparse filters each coupled between an input and an output for filtering the sensor signal received at the coupled input; and
    one or more integrators coupled to one or more of said sparse filters for integrating a signal output from the coupled sparse filter and to provide the integrated signal to the corresponding output;
    wherein the plurality of sparse filters are digital filters that comprise:
    a delay line having P delay elements through which digital sample values of the sensor signal received at the coupled input pass; and
    Q coefficient multipliers for multiplying sample values from selected ones of the delay elements with a respective filter coefficient; and
    wherein P and Q are integer values with Q having a value less than 30% of P.

2. A sensor array according to claim 1, comprising a plurality of outputs and comprising a sparse filter between each input and each output.

3. A sensor array according to claim 2, comprising means for combining the filtered signals obtained from the sparse filters coupled to the same output and wherein an integrator is operable to integrate each combined signal to provide an output signal.

4. A sensor array according to claim 1, wherein each sensor is for sensing mechanical or acoustic signals.

5. A sensor according to claim 4, wherein each sensor comprises a microphone or an accelerometer.

6. A sensor array according to claim 1, wherein the sensors are operable to sense a mix of signals generated from a plurality of sources and wherein the sparse filters are arranged so that the or each output mainly comprises the signal from one of said sources.

7. A sensor array according to claim 1, comprising one or more pick buffers for temporarily storing input signal samples during filter processing by said sparse filters.

8. An actuator array system comprising:
    a plurality of actuators;
    one or more inputs, each for receiving a respective control signal;
    a plurality of outputs, each for outputting a signal to a respective one of the plurality of actuators;
    a plurality of sparse filters each coupled between an input and an output for filtering the control signal received at the coupled input; and
    a plurality of integrators coupled to one or more of said sparse filters for integrating a signal output from the coupled sparse filter and to provide the integrated signal to the corresponding output;
    wherein the plurality of sparse filters are digital filters that comprise:
    a delay line having P delay elements through which digital sample values of the control signal received at the coupled input pass; and
    Q coefficient multipliers for multiplying sample values from selected ones of the delay elements with a respective filter coefficient; and
    wherein P and Q are integer values with Q having a value less than 30% of P.

9. An actuator array according to claim 8, comprising a plurality of inputs and comprising a sparse filter between each input and each output.

10. An actuator array according to claim 9, comprising means for combining the filtered signals obtained from the sparse filters coupled to the same output and wherein an integrator is operable to integrate each combined signal to provide an output signal.

11. An actuator array according to claim 8, wherein each actuator is for generating mechanical or acoustic signals.

12. An actuator array according to claim 11, wherein each actuator comprises a loudspeaker or an exciter.

13. An actuator array according to claim 8, wherein the actuators are operable to generate signals in order to establish a field pattern within a region of interest.

14. An actuator array according to claim 8, comprising one or more pick buffers for temporarily storing control signal samples during filter processing by said sparse filters.

15. A sensor array processing system comprising:
a plurality of inputs, each for receiving a signal from a respective one of a plurality of sensors;
one or more outputs for outputting signals derived using the signals from said inputs;
a plurality of sparse filters each coupled between an input and an output for filtering the sensor signal received at the coupled input; and
one or more integrators coupled to one or more of said sparse filters for integrating a signal output from the coupled sparse filter and to provide the integrated signal to the corresponding output;
wherein the plurality of sparse filters are digital filters that comprise:
a delay line having P delay elements through which digital sample values of the sensor signal received at the coupled input pass; and
Q coefficient multipliers for multiplying sample values from selected ones of the delay elements with a respective filter coefficient; and
wherein P and Q are integer values with Q having a value less than 30% of P.

16. An actuator array processing system comprising:
one or more inputs, each for receiving a respective control signal;
a plurality of outputs, each for outputting a signal to a respective one of a plurality of actuators;
a plurality of sparse filters each coupled between an input and an output for filtering the control signal received at the coupled input; and
a plurality of integrators coupled to one or more of said sparse filters for integrating a signal output from the coupled sparse filter and to provide the integrated signal to the corresponding output;
wherein the plurality of sparse filter are digital filters that comprise:
a delay line having P delay elements through which digital sample values of the control signal received at the coupled input pass; and
Q coefficient multipliers for multiplying sample values from selected ones of the delay elements with a respective filter coefficient; and
wherein P and Q are integer values with Q having a value less than 30% of P.

* * * * *